(12) United States Patent
Hong

(10) Patent No.: US 6,583,025 B2
(45) Date of Patent: Jun. 24, 2003

(54) METHOD OF FORMING A TRENCH ISOLATION STRUCTURE COMPRISING ANNEALING THE OXIDATION BARRIER LAYER THEREOF IN A FURNACE

(75) Inventor: Soo-Jin Hong, Seoul (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/847,280

(22) Filed: May 3, 2001

(65) Prior Publication Data

US 2002/0004282 A1 Jan. 10, 2002

(30) Foreign Application Priority Data

Jul. 10, 2000  (KR) .......................... 2000-39323
Nov. 23, 2000  (KR) .......................... 2000-69980

(51) Int. Cl.[7] .......................... H01L 21/2176
(52) U.S. Cl. .................. 438/424; 438/296; 438/404
(58) Field of Search .................. 438/296, 404, 438/424, 435, 221, 439

(56) References Cited

U.S. PATENT DOCUMENTS

| | | | | |
|---|---|---|---|---|
| 4,571,819 A | * | 2/1986 | Rogers et al. ........... | 29/576 W |
| 5,643,823 A | * | 7/1997 | Ho et al. ........... | 437/67 |
| 5,747,866 A | | 5/1998 | Ho et al. | |
| 5,763,315 A | * | 6/1998 | Benedict et al. ............ | 438/424 |
| 5,989,978 A | * | 11/1999 | Peidous ........... | 438/436 |
| 6,037,018 A | * | 3/2000 | Jang et al. ............... | 427/579 |
| 6,037,238 A | * | 3/2000 | Chang et al. ............... | 438/426 |
| 6,118,168 A | * | 9/2000 | Moon et al. ............... | 257/513 |
| 6,140,208 A | * | 10/2000 | Agahi et al. ............... | 438/437 |
| 6,165,854 A | * | 12/2000 | Wu ........... | 438/296 |
| 6,165,869 A | * | 12/2000 | Qian et al. ........... | 438/424 |
| 6,251,746 B1 | * | 6/2001 | Hong et al. ........... | 438/424 |
| 6,255,176 B1 | * | 7/2001 | Kim et al. ........... | 438/296 |
| 6,255,194 B1 | * | 7/2001 | Hong ........... | 438/435 |

* cited by examiner

Primary Examiner—Matthew Smith
Assistant Examiner—Renzo N. Rocchegiani
(74) Attorney, Agent, or Firm—Volentine Francos, PLLC

(57) ABSTRACT

A method of forming a trench isolation structure prevents a nitride liner from being over-etched, i.e., prevents the so-called dent phenomenon from occurring. An etching mask pattern is formed on a semiconductor substrate. A trench is formed in the substrate by using the etching mask pattern as an etching mask. A nitride liner, serving as an oxidation barrier layer, is formed at the sides and bottom of the trench, and is then annealed in a furnace to density the same. In a subsequent etching process, such as that used to remove the etching mask pattern, the densified nitride liner resists being etched. Accordingly, a trench isolation structure having a good profile is produced.

19 Claims, 6 Drawing Sheets

METHOD OF FORMING A TRENCH ISOLATION STRUCTURE COMPRISING ANNEALING THE OXIDATION BARRIER LAYER THEREOF IN A FURNACE

BACKGROUND OF THE INVENTION

1. Field of the Invention

The present invention relates to a method of manufacturing a semiconductor device. More particularly, the present invention relates to a method of forming isolated trenches in a semiconductor substrate.

This is a counterpart of, and claims priority to, Korean Patent Application No. 2000-39323, filed Jul. 10, 2000, and Korean Patent Application No. 2000-69980, filed Nov. 23, 2000, the contents of each of which are incorporated herein by reference in their entirety.

2. Description of the Related Art

In a conventional semiconductor manufacturing process referred to as a trench isolation process, a semiconductor substrate is etched to form a series of trenches, the trenches are filled with an insulating material, and then the insulating material is planarized to form an insulating layer. Because the substrate itself is directly etched to form the trench, stress is produced along an inner wall of the substrate defining the trench, thereby producing defects in the substrate. An oxide liner and a nitride liner are formed on the inner wall defining the trench to alleviate such stress. The nitride liner, however, is over-etched during a subsequent process, whereby a so-called dent phenomenon occurs at an edge of a trench isolation layer.

FIG. 1 illustrates such a problem in a conventional trench isolation structure. A substrate 10 is etched to form a trench therein. A silicon nitride layer is conventionally used as an etching mask in the etching process for forming the trench. An oxide liner 12 and a nitride liner 13 are sequentially formed on an inner wall of the semiconductor substrate 10 defining the trench. An insulating layer 15 is then formed in trench. Next, the etching mask is removed using a wet etching process. Unfortunately, the nitride liner 13 on a sidewall of the trench is also etched while the etching mask is being removed. Therefore, an edge of the trench isolation structure becomes indented, i.e., the so-called dent phenomenon occurs in the region designated by reference numeral 17. If a gate pattern of a transistor is formed at the indented region, the intensity of the electric field spikes at that region and the threshold voltage of the transistor is lowered accordingly.

The dent phenomenon 17 is alleviated somewhat by a densifying process performed mainly for reducing the rate at which the insulating material can be etched. The densifying process comprises annealing the insulating layer 15. The annealing process for densifying the insulating layer 15 also densities the nitride liner 13, whereby the etching-tolerance of the nitride liner 13 is enhanced. The annealing process is performed at a high temperature of 1000–1150° C. in a nitrogen ambient. However, such a high temperature annealing process creates stress between the insulating layer 15 and the semiconductor substrate 10. The stress is known to facilitate the occurrence of slip or leakage current which degrades the performance of the final device. Accordingly, the recent trend is toward the use of a low temperature annealing process, specifically a nitrogen annealing process or a wet annealing process. The nitrogen annealing process is carried out at a temperature of 700–900° C. in a nitrogen ambient, whereas the wet annealing process is carried out at a temperature of 700–900° C. in a vapor ambient.

Unfortunately, the low temperature annealing process does not densify the nitride liner sufficiently to prevent a significant dent phenomenon from occurring.

SUMMARY OF THE INVENTION

Therefore, an object of the present invention is to provide a method of forming a trench isolation structure which prevents a nitride liner serving as an oxidation barrier layer from being over-etched during an etching process performed after the nitride layer has been formed.

To achieve this object, the present invention provides a trench isolation method in which the oxidation barrier layer is specifically densified in a furnace before the etching process is conducted. First, a trench is formed in a semiconductor substrate. Then the oxidation barrier layer is formed on an inner wall of the substrate that defines the trench. The oxidation barrier layer is annealed in a furnace in a process that densities the layer completely. Once the oxidation barrier layer is densified, an insulating layer is formed on the oxidation barrier layer to fill the trench.

The trench is formed as follows. A pad oxide layer and an etch-stop layer are sequentially formed on the substrate. Preferably, the etch-stop layer is made of silicon nitride. The pad oxide layer and the etch-stop layer are then patterned such that a predetermined area of the substrate is exposed. The substrate is then etched using the etching mask pattern as an etching mask, to form the trench.

The oxidation barrier layer is made of silicon nitride. Preferably, the annealing process is carried out at a temperature of 1000° C. or more in a nitrogen ambient. Alternatively, the annealing process may be carried out at a temperature of 800° C. or more in an oxygen and vapor ambient.

Further, an oxide liner is formed between the inner wall that defines the trench and the oxidation barrier layer. Preferably, a capping oxide layer is additionally formed between the oxidation barrier layer and the insulating layer.

Insulating material is then deposited on the structure and is then planarized to form the insulating layer in the trench.

Subsequently, the etching mask pattern is etched away. Regardless, the oxidation barrier layer is not over-etched by this process because it has been densified.

DETAILED OF THE DESCRIPTION OF THE PREFERRED EMBODIMENT

Figure 1:
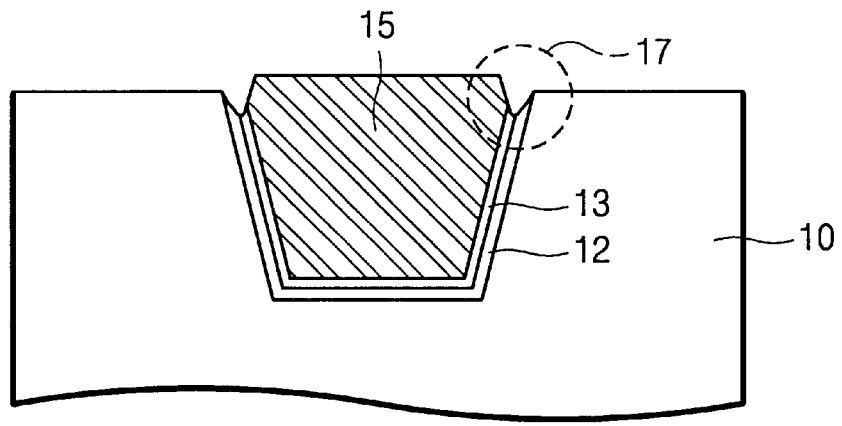
FIG. 1 is a cross-sectional view of a trench isolation layer formed in accordance with the prior art.
Figure 2A:
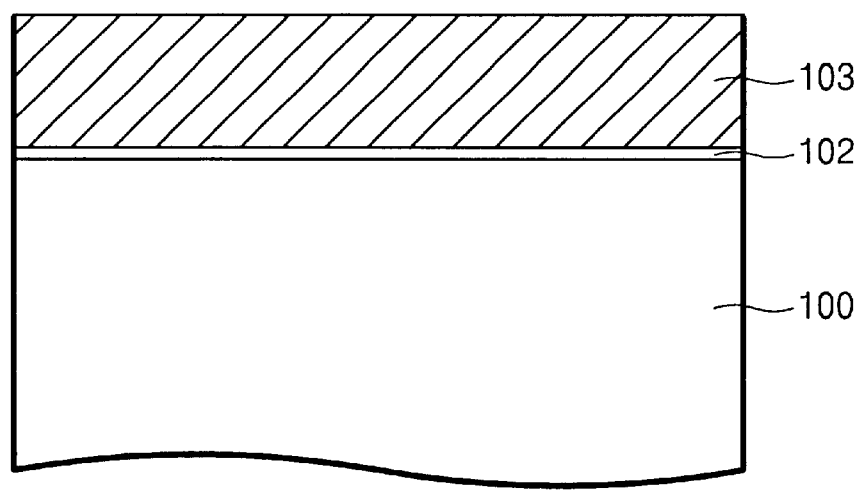
FIG. 2A to FIG. 2G are cross-sectional views of a substrate, showing the progression of a trench isolation method according to the present invention.

Referring to FIG. 2A, a thermal oxide layer is grown over the entire surface of a semiconductor substrate 100, thereby forming a pad oxide layer 102. The pad oxide layer 102 serves as a buffer layer to alleviate stress that would otherwise be applied to the substrate 100 during subsequent processing. An etch-stop layer 103 is then formed on the pad oxide layer 102. Preferably, the etch-stop layer 103 is made of a material (e.g., silicon nitride) having an etch selectivity with respect to the substrate 100.

Figure 2B:
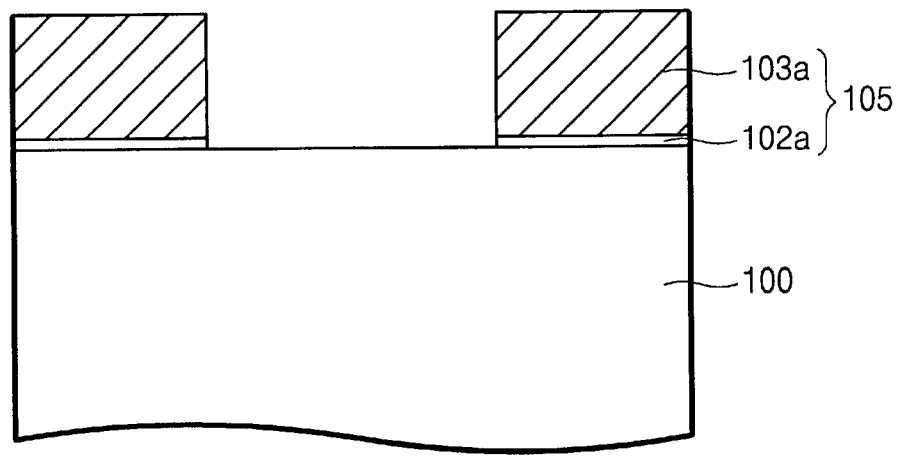

Referring to FIG. 2B, a photoresist layer is formed on the etch-stop layer 103 and is then patterned, thereby forming a photoresist pattern (not shown) that defines a trench area. Using the photoresist pattern as an etching mask, the etch-stop layer 103 and the pad oxide layer 102 are sequentially etched to expose a predetermined area of a semiconductor substrate 100. As a result, a mask pattern 105 is formed of a pad oxide layer pattern 102a and an etch-stop layer pattern 103a stacked one atop the other. Then, the photoresist pattern is removed using, for example, an oxygen plasma ashing process.

Figure 2C:
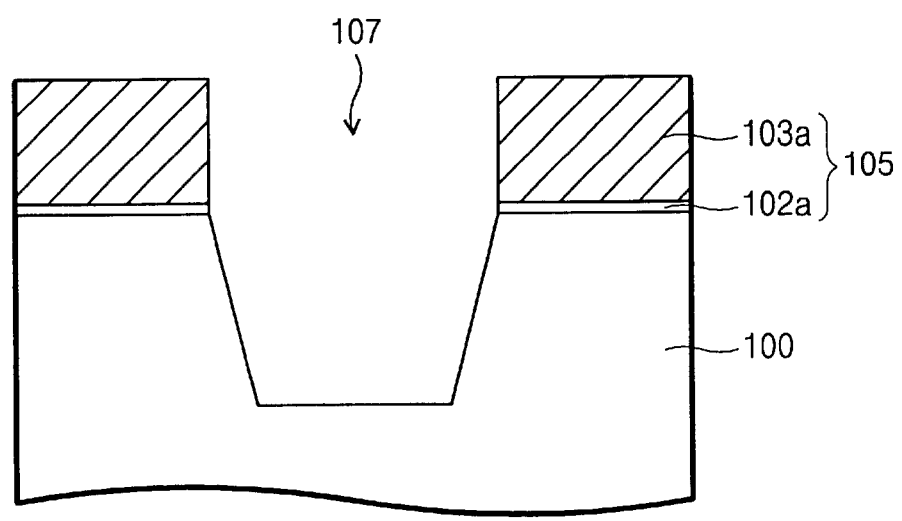
Figure 2D:
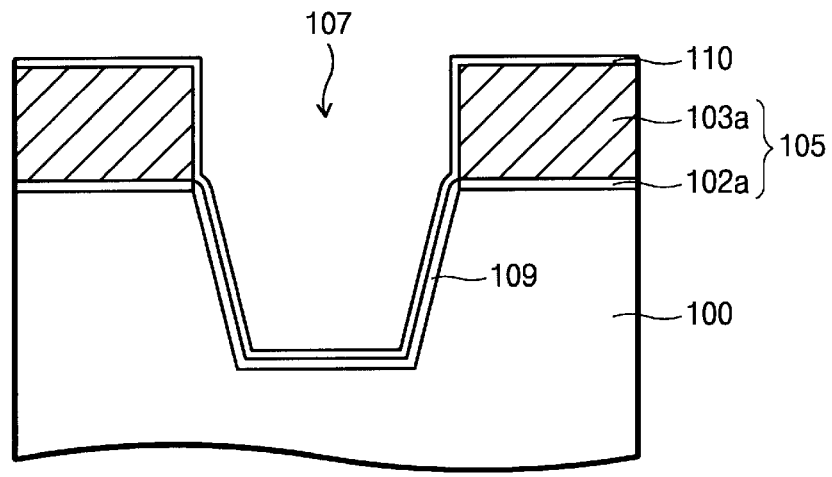

Referring to FIGS. 2C and 2D, the exposed area of the semiconductor substrate 100 is dry etched using the etching mask pattern 105 as an etching mask to form a trench 107. Once the trench 107 is formed, the substrate 100 may be attacked. In order to prevent further etching of the substrate 100, an oxide liner 109 is formed on surfaces of the substrate defining the sides and bottom of the trench 107. The oxide liner 109 comprises, for example, a thermal oxide, a chemical vapor deposition (CVD) oxide, or a combination thereof. If the oxide liner 109 is made of a CVD oxide, a separate annealing process is required. An oxidation barrier layer 110 (e.g., a silicon nitride layer) is formed over the entire surface of the structure in which the oxide liner 109 has been formed. The oxidation barrier layer 110 serves to prevent the substrate 100 from being stressed when the walls of the trench 107 are oxidized during a subsequent annealing process.

Preferably, a capping layer (not shown) is formed to prevent the oxidation barrier layer from being attacked during the subsequent process of forming an insulating layer in the trench over the oxidation barrier layer 110. The capping layer is made of, for example, a medium temperature oxide (MTO).

Figure 2E:
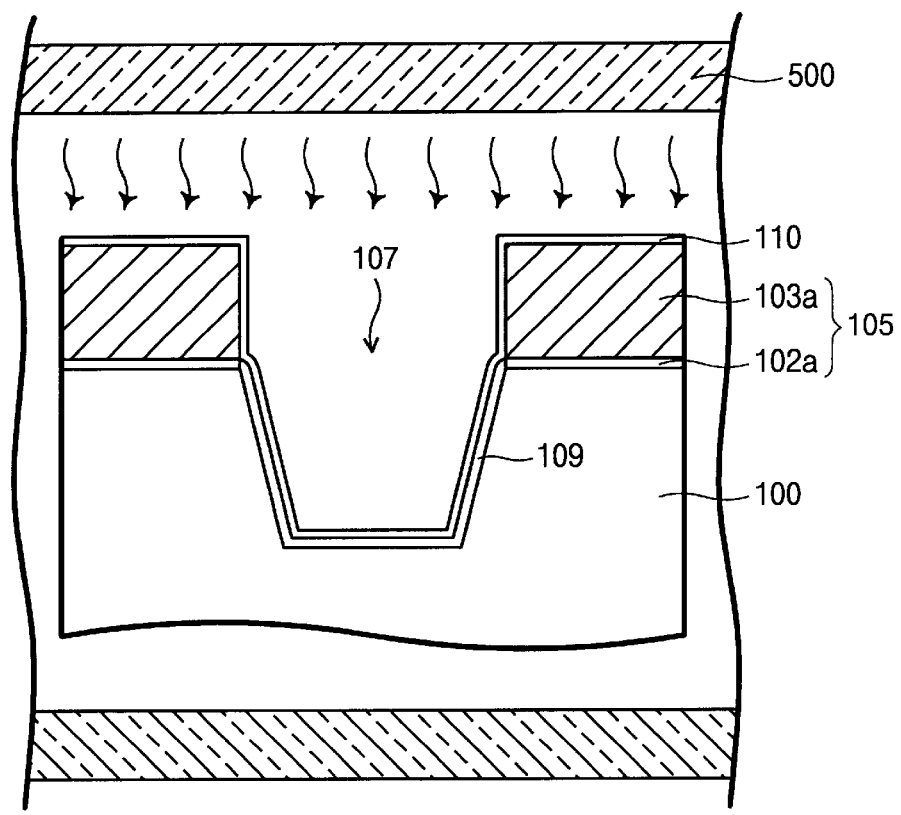

Referring to FIG. 2E, as a characteristic feature of the present invention, the oxidation barrier layer 110 is moved into a furnace 500 and the oxidation barrier layer 110 is annealed in the furnace 500. The oxidation barrier layer 110 is thus densified to thereby reduce the rate at which the layer can be etched. The annealing process is carried out in the furnace 500 preferably in a nitrogen ambient at a temperature of 1000° C. The annealing process may also be carried out in the furnace 500 in an oxygen and vapor ambient at a temperature of 800° C. Again, densifying the oxidation barrier layer 110 in this way lowers the rate at which the layer will be etched in the subsequent etching process for removing the etching mask pattern 105.

Figure 2F:
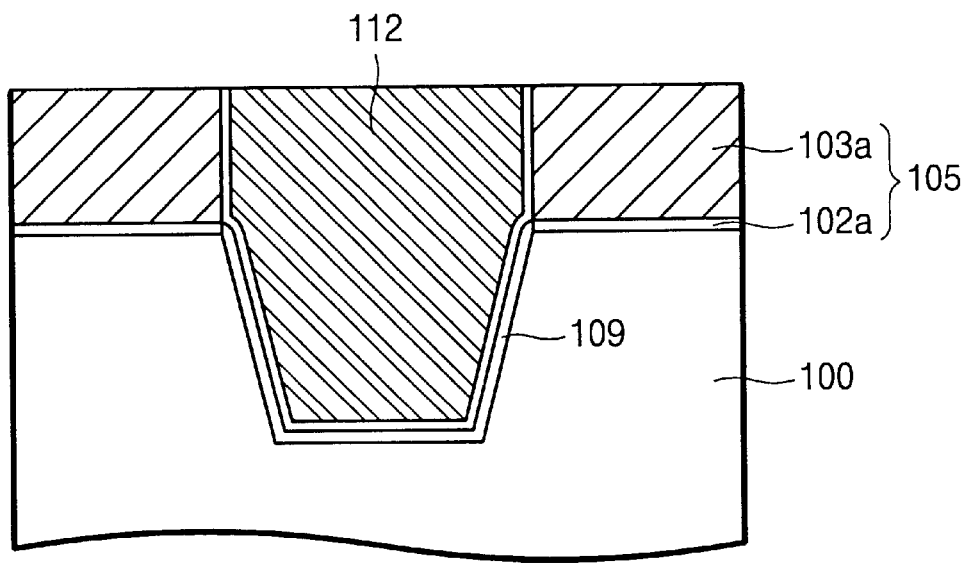

Referring to FIG. 2F, an insulating layer is formed over the entire surface of the annealed structure. The insulating layer is then preferably densified to enhance the tolerance of the insulating layer to a subsequent wet etch process. The densifying of the insulating layer comprises, for example, a nitrogen or wet annealing process. The nitrogen annealing process is carried out at a temperature of 600–800° C. in a nitrogen ambient, whereas the wet annealing process is carried out at a temperature of 700–900° C. in a vapor ambient.

Once the densifying process is completed, the insulating layer is planarized (etched) down to the upper surface of the etching mask pattern 105, whereby an insulating layer pattern 112 is formed. The planarizing of the insulating layer is carried out using a chemical mechanical polishing (CMP) process employing a silica or ceria slurry.

Figure 2G:
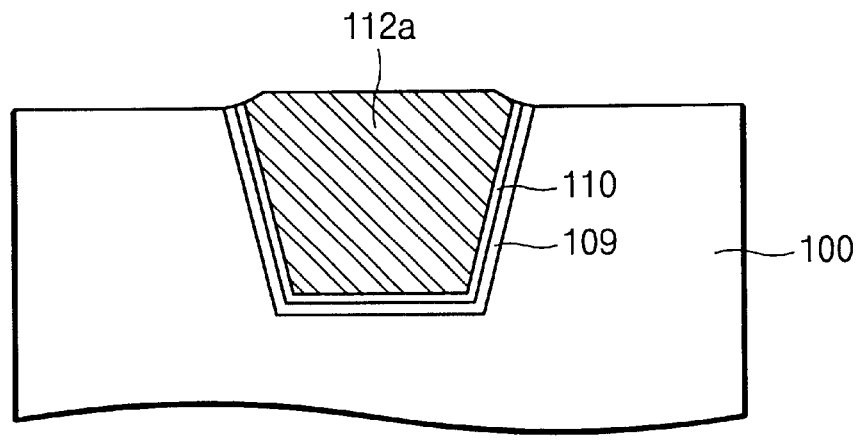

Referring to FIG. 2G, the etching mask pattern 105 remaining on the semiconductor substrate is removed to complete the formation of the trench isolation layer 112a.

For example, the etch-stop layer pattern 103a made of silicon nitride is removed by a phosphoric acid solution, and the pad oxide layer pattern 102a is removed by a fluoric acid solution.

In the method of the present invention described above, a separate densifying process is carried out for reducing the etching rate of the oxidation barrier layer 110 formed at the inner wall of a trench 107. Therefore, the oxidation barrier layer 110 is prevented from being over-etched during the subsequent etching process for removing the etching mask pattern 105.

Comparative test results between the prior art and the present invention will now be described with reference to FIGS. 3A to 3D.

Figure 3A:
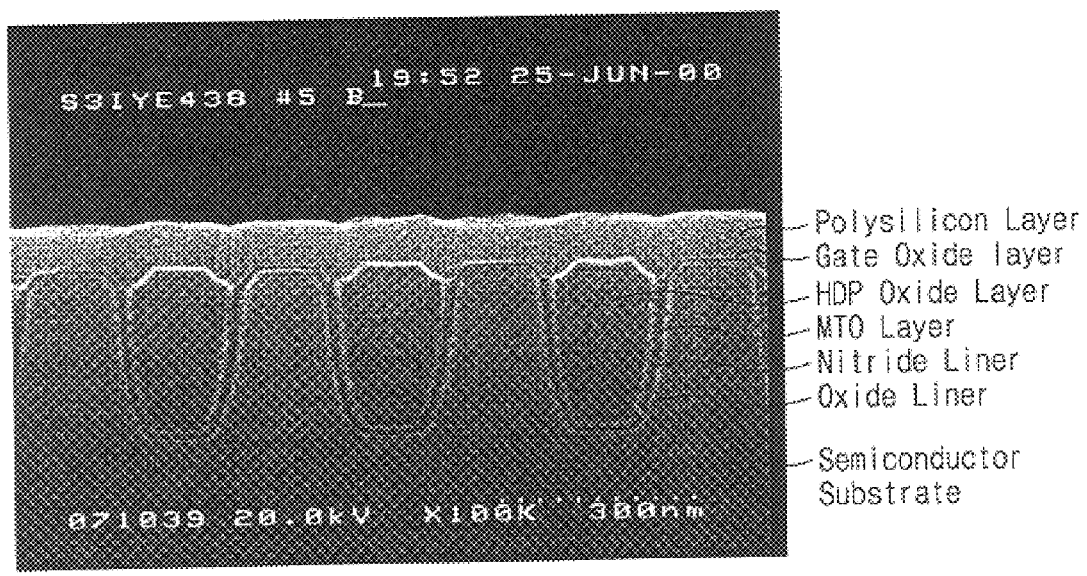
FIG. 3A to FIG. 3D are scanning electron microscope (SEM) photographs showing profiles of trench isolation layers formed in accordance with the prior art and in accordance with the present invention.
Figure 3B:
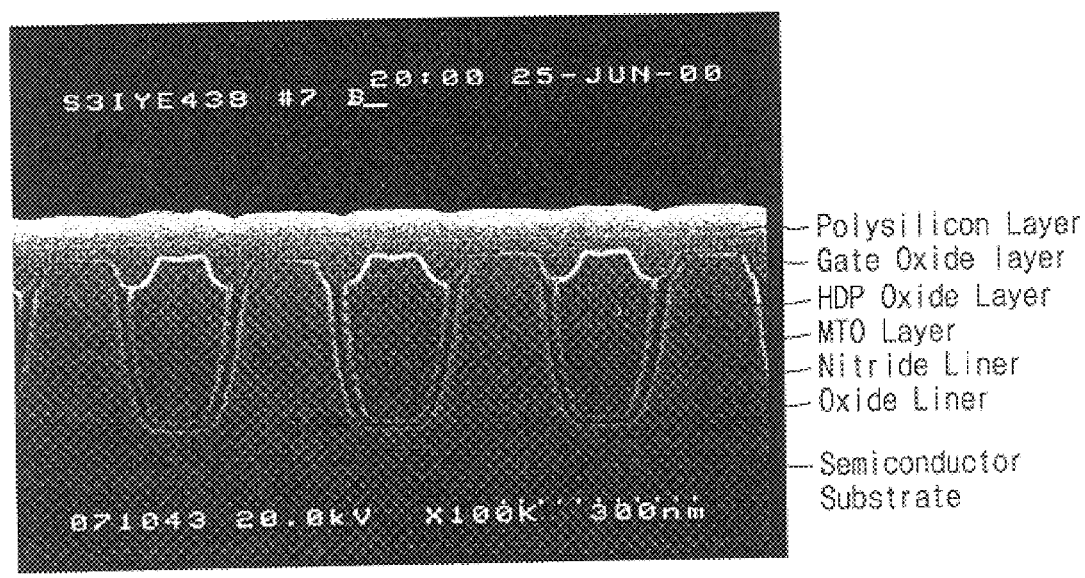
Figure 3C:
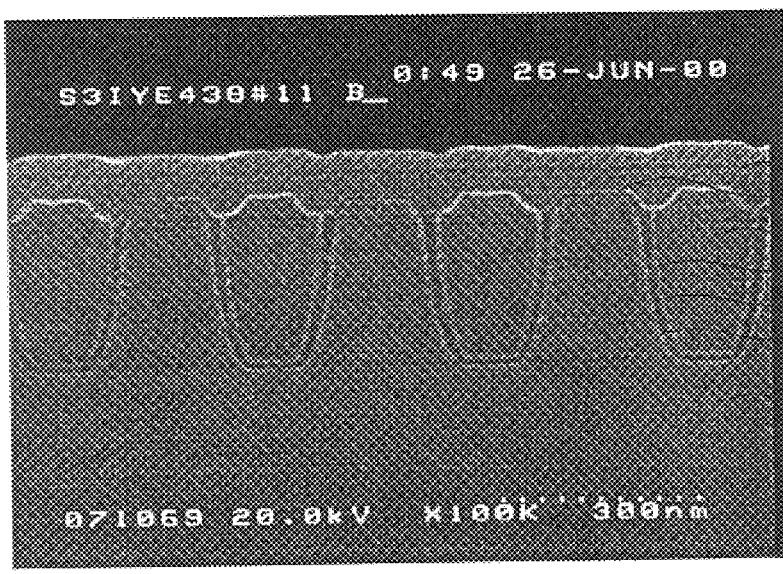
Figure 3D:
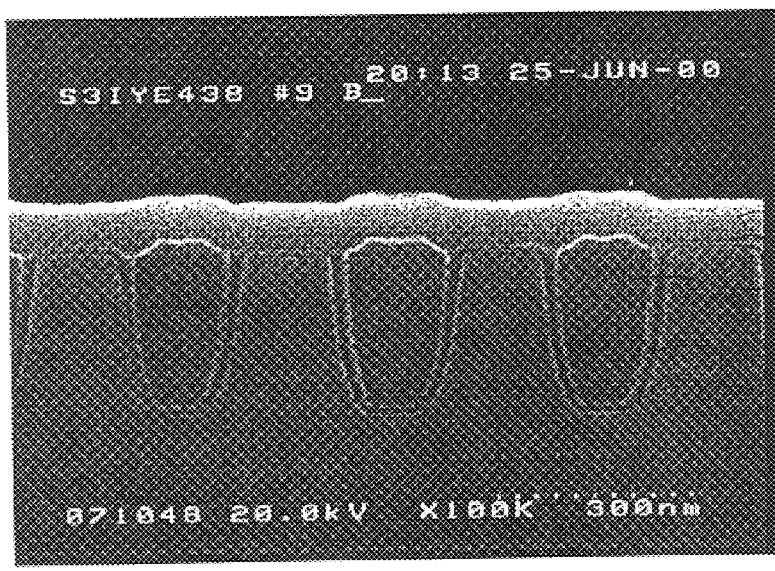

FIGS. 3A to 3C are scanning electron microscope (SEM) photographs of profiles of trench isolation structures formed for use in comparison with a trench isolation structure formed according to the present invention (FIG. 3D). The method under which the trench isolation structures were formed was as follows. A semiconductor substrate was etched to form a trench. A thermal oxide layer having a thickness of 50 Å was formed on an inner wall of the substrate defining the trench. Next, a nitride liner having a thickness of 45 Å was formed on the thermal oxide layer. Then, a medium temperature oxide layer having a thickness of 100 Å was formed on the nitride liner. The trench was filled with a high density plasma (HDP) oxide layer, thereby completing the formation of the trench isolation structure. A gate oxide layer having a thickness of 70 Å and a polysilicon layer having a thickness of 1000 Å were then formed over the entire surface of the substrate. The difference between the methods of the prior art and the present invention reside in an annealing of the nitride liner and the HDP oxide layer, as will be made more clear below.

The nitride liners of the trench isolation structures shown in FIG. 3A and FIG. 3B were not annealed prior to the forming of the HDP oxide layer (as in the prior art). Rather, the HDP oxide layers of the trench isolation structures of FIGS. 3A and 3B were annealed at temperatures of 1000° C. and 700° C., respectively, in a nitrogen ambient.

The temperature at which the densifying of the oxide layer is carried out has a great influence on the dent phenomenon of the nitride liner. As is clear from FIGS. 3A and 3B, the dent phenomenon of the nitride liner is significantly more pronounced when the HDP oxide layer is annealed at a temperature of 700° C. than when the HDP oxide layer is formed and annealed at a temperature of 1000° C.

In the case of the trench isolation structure shown in FIG. 3C, the nitride liner was annealed by a conventional rapid thermal process (RTP), wherein the nitride liner and the MTO layer were formed and rapidly annealed at a temperature of 1050° C. for 90 seconds. In other words, the HDP oxide layer was formed after the nitride liner and MTO layer were subjected to the RTP. A low temperature densifying process was performed on the HDP oxide layer, comprising annealing the HDP oxide layer at a temperature of 700° C. in a nitrogen ambient.

As shown by FIG. 3C, when the nitride liner is subjected to a conventional RTP, the dent phenomenon of the nitride liner is less pronounced than in the case shown in FIG. 3B in which no RTP is performed. Nonetheless, this step is limited insofar as its ability to mitigate the dent phenomenon is concerned. This is because only the surface of the nitride liner is densified when the nitride liner is annealed by the RTP.

FIG. 3D shows the profile of a trench isolation structure produced in accordance with the present invention. In this case, the nitride liner and MTO layer were formed and annealed in a furnace in an oxygen ambient at a temperature of 1150° C. for an hour. Then, the HDP oxide layer was formed, and a low temperature densifying process was performed on the HDP oxide layer, comprising annealing the HDP oxide layer at a temperature of 700° C. in a nitrogen ambient. As is quite clear from FIG. 3D, the dent phenomenon of the nitride liner is scarcely present. This is because the annealing process carried out in a furnace can densify the nitride layer substantially throughout the entire thickness thereof, whereas the conventional RTP can not.

As was described above, according to the present invention, the oxidation barrier layer is annealed in a furnace in a process dedicated to that purpose. Therefore, a subsequently performed etching process does not incidentally over-etch the oxidation barrier layer. Thus, a trench isolation structure having a good profile, i.e., one that scarcely exhibits any denting phenomenon whatsoever, can be formed. In addition, a low temperature annealing process for densifying the insulating layer is used, thereby minimizing the stress that is exerted on the semiconductor substrate.

Finally, although the present invention has been described above in connection with the preferred embodiment thereof, various changes to and modifications of the present invention will become apparent to those skilled in the art. Therefore, all such changes and modifications are seen to be within the true spirit and scope of the invention as defined by the appended claims.

What is claimed is:

1. A trench isolation method comprising the steps of:
   forming a trench in a semiconductor substrate;
   forming an oxidation barrier layer on an inner wall of the substrate that defines the trench;
   once the oxidation barrier layer has been formed, annealing the structure in a furnace until the oxidation barrier layer is densified throughout substantially its entire thickness; and
   subsequently forming an insulating layer in the trench on the annealed oxidation barrier layer.

2. The method as claimed in claim 1, wherein said step of forming the oxidation barrier layer comprises forming a layer of silicon nitride on the inner wall of the substrate that defines the trench.

3. The method as claimed in claim 1, wherein said step of annealing comprises annealing the oxidation baffler layer at a temperature of 1000° C. in a nitrogen ambient.

4. The method as claimed in claim 1, wherein said step of annealing comprises annealing the oxidation baffler layer at a temperature of at least 800° C. in an oxygen and water vapor ambient.

5. The method as claimed in claim 1, and further comprising a step of densifying the insulating layer.

6. The method as claimed in claim 5, wherein said step of densifying comprises annealing the insulating layer at a temperature of 600–800° C. in a nitrogen ambient.

7. The method as claimed in claim 5, wherein said step of densifying comprises annealing the insulating layer at a temperature of 700–900° C. in a water vapor ambient.

8. The method as claimed in claim 1, wherein said step of forming the trench comprises forming an etching mask pattern on the substrate, the etching mask pattern exposing a predetermined area of the substrate, and etching the exposed area of the substrate using the etching mask pattern as an etching mask.

9. The method as claimed in claim 7, wherein the forming the etching mask pattern comprises forming a pad oxide layer on the substrate, forming a silicon nitride layer on the pad oxide layer, and sequentially patterning the silicon nitride layer and the pad oxide layer to expose the predetermined area of the substrate.

10. The method as claimed in claim 1, and further comprising a step of forming an oxide liner between the inner wall that defines the trench and the oxidation barrier layer.

11. The method as claimed in claim 10, wherein the oxide liner is made of a material selected from the group consisting of thermal oxides, chemical vapor deposition (CVD) oxides, and a combination thereof.

12. The method as claimed in claim 1, and further comprising a step of forming a capping layer between the oxidation barrier layer and the insulating layer.

13. A trench isolation method comprising the steps of:
    forming an etching mask pattern on a substrate, the etching mask pattern exposing a predetermined area of the substrate;
    etching the exposed area of the substrate using the etching mask pattern as an etching mask to form a trench in the substrate;
    forming an oxidation barrier layer on an inner wall of the substrate that defines the trench;
    once the oxidation barrier layer has been formed, annealing the structure in a furnace until the oxidation barrier layer is densified throughout substantially its entire thickness;
    subsequently forming an insulating layer in the trench on the annealed oxidation barrier layer; and
    after the oxidation barrier layer has been annealed, etching away the etching mask pattern.

14. The method as claimed in claim 13, wherein said step of annealing comprises annealing the oxidation baffler layer at a temperature of 1000° C. in a nitrogen ambient.

15. The method as claimed in claim 14, wherein said step of forming the oxidation barrier layer comprises forming a layer of silicon nitride on the inner wall of the substrate that defines the trench, and said step of annealing comprises annealing the layer of silicon nitride at 1050° C. for one hour.

16. The method as claimed in claim 13, wherein said step of annealing comprises annealing the oxidation baffler layer at a temperature of at least 800° C. in an oxygen and water vapor ambient.

17. The method as claimed in claim 13, and further comprising a step of densifying the insulating layer.

18. The method as claimed in claim 17, wherein said step of densifying comprises annealing the insulating layer in a nitrogen ambient.

19. The method as claimed in claim 17, wherein said step of densifying comprises annealing the insulating layer at a temperature of 700–900° C. in a water vapor ambient.

* * * * *